(12) United States Patent
Akarvardar et al.

(10) Patent No.: US 9,960,257 B2
(45) Date of Patent: May 1, 2018

(54) COMMON FABRICATION OF MULTIPLE FINFETS WITH DIFFERENT CHANNEL HEIGHTS

(71) Applicant: GLOBALFOUNDRIES Inc., Grand Cayman (KY)

(72) Inventors: Murat Kerem Akarvardar, Saratoga Springs, NY (US); Jody A. Fronheiser, Delmar, NY (US); Ajey Poovannummoottil Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 14/656,671

(22) Filed: Mar. 12, 2015

(65) Prior Publication Data
US 2016/0268400 A1    Sep. 15, 2016

(51) Int. Cl.
| | |
|---|---|
| *H01L 21/00* | (2006.01) |
| *H01L 21/84* | (2006.01) |
| *H01L 29/66* | (2006.01) |
| *H01L 29/417* | (2006.01) |
| *H01L 29/06* | (2006.01) |

(52) U.S. Cl.
CPC .... *H01L 29/66795* (2013.01); *H01L 29/0649* (2013.01); *H01L 29/41791* (2013.01); *H01L 29/66545* (2013.01)

(58) Field of Classification Search
CPC ................. H01L 21/823431; H01L 29/66545
USPC .......................................................... 438/157
See application file for complete search history.

(56) References Cited

U.S. PATENT DOCUMENTS

| | | | |
|---|---|---|---|
| 2011/0147848 A1 | 6/2011 | Kuhn et al. | |
| 2014/0077296 A1* | 3/2014 | Yamashita | ...... H01L 21/823431 |
| | | | 257/347 |
| 2016/0020149 A1* | 1/2016 | Kim | ................ H01L 21/823431 |
| | | | 438/14 |

OTHER PUBLICATIONS

Sachid, Angada B., "Denser and More Stable SRAM Using FinFETs With Multiple Fin Heights," IEEE Transactions on Electron Devices, vol. 59, No. 8, Aug. 2012, pp. 2037-2041.

* cited by examiner

*Primary Examiner* — Hsin-Yi Hsieh
(74) *Attorney, Agent, or Firm* — Wayne F. Reinke, Esq.; Heslin Rothenberg Farley & Mesiti P.C.

(57) ABSTRACT

Commonly fabricated FinFET type semiconductor devices with different (i.e., both taller and shorter) heights of an entirety of or only the channel region of some of the fins. Where only the channel of some of the fins has a different height, the sources and drains have a common height higher than those channels. The different fin heights are created by recessing some of the fins, and where only the channels have different heights, the difference is created by exposing a top surface of each channel intended to be shorter, the other channels being masked, and partially recessing the exposed channel(s). In both cases, the mask(s) may then be removed and conventional FinFET processing may proceed.

12 Claims, 12 Drawing Sheets

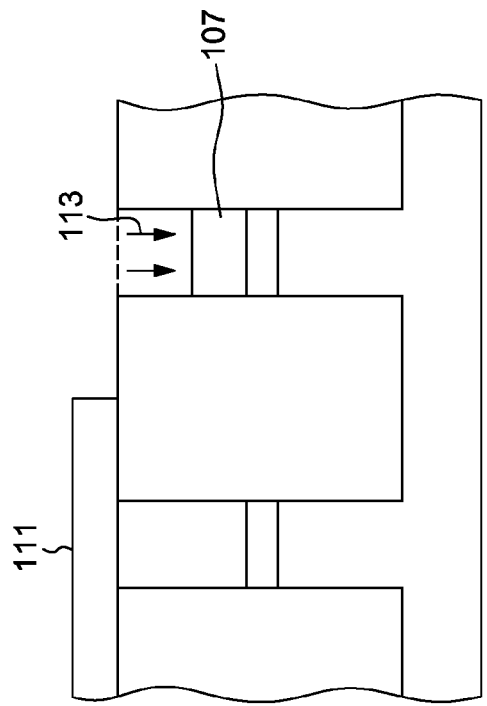
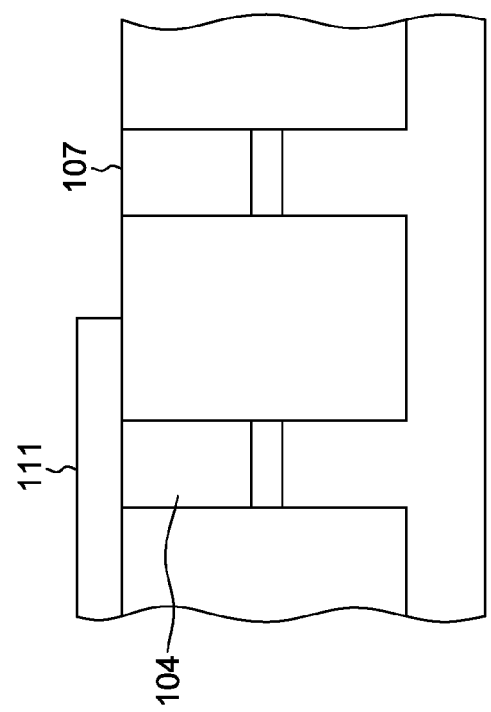
FIG. 4
FIG. 5

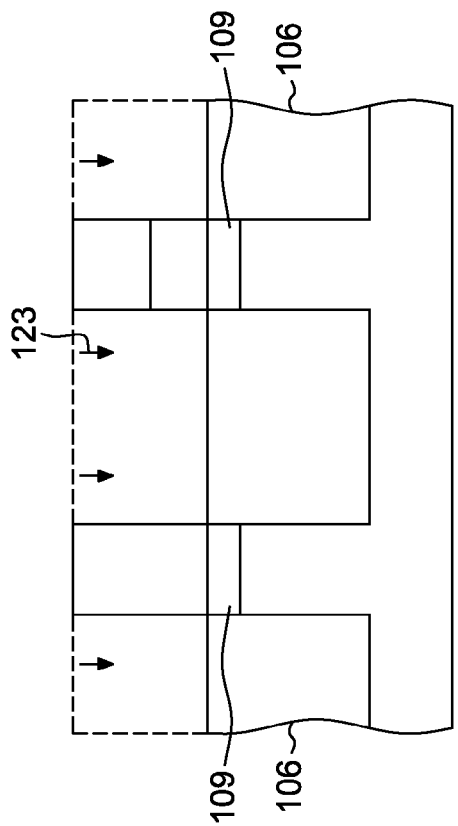
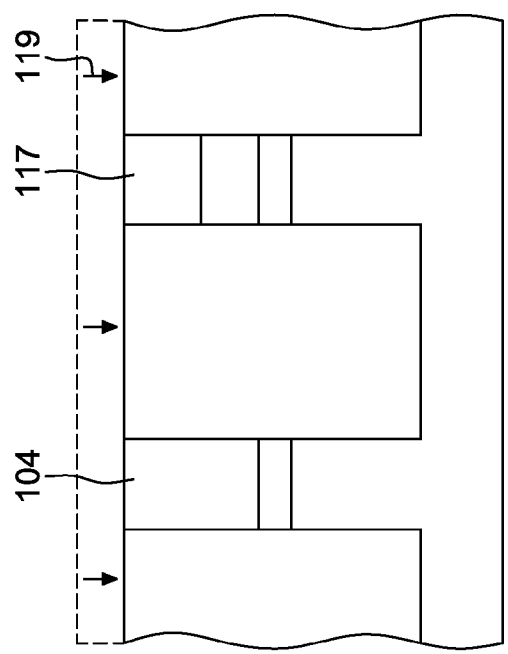
FIG. 8
FIG. 9

COMMON FABRICATION OF MULTIPLE FINFETS WITH DIFFERENT CHANNEL HEIGHTS

BACKGROUND OF THE INVENTION

Technical Field

The present invention generally relates to three-dimensional semiconductor structures. More particularly, the present invention relates to commonly fabricated FinFET type devices with different channel heights.

Background Information

The ever-shrinking size of semiconductor devices has obvious benefits, but with every node size decrease, new issues of design and reliability arise. For example, two key performance metrics for SRAM are stability and integration density (footprint). However, those same two parameters compete in designing the memory. Increasing stability typically requires a size increase, which reduces density (increases footprint).

In the past, one way to address the issue above was to simulate different height fins by recessing isolation material surrounding the bodies of the fins desired to effectively be taller than those not recessed. However, a non-uniform height of the isolation material poses challenges throughout the fabrication process.

Thus, a need continues to exist for a way to improve stability of FinFET type semiconductor devices without sacrificing size/density.

SUMMARY OF THE INVENTION

The shortcomings of the prior art are overcome and additional advantages are provided through the provision, in one aspect, of a method of fabricating multiple non-planar semiconductor devices with different fin heights only in the channel region while the fin heights remain the same in the source-drain (SD) region. The method includes providing a starting semiconductor structure, the starting semiconductor structure including a substrate and at least two fins on the substrate and surrounded on front and back sides thereof by isolation material. The method further includes recessing at least a portion of one or more and less than all of the at least two fins, resulting in at least one fin recess The recessing includes creating dummy gate stacks and spacers over a channel regions of the at least two fins, each of the dummy gate stacks including a bottom dielectric layer, a middle layer of dummy gate material, and a top gate cap. The recessing further includes creating sources and drains in source and drain regions, respectively, of the at least two fins, removing the dummy gate stacks and top portions of the spacers, the removing exposing top surfaces of the channel regions while avoiding exposing surfaces of the channel regions other than the top surfaces, and recessing the top surfaces of the channel regions of the one or more and less than all of the at least two fins while avoiding recessing the sources and drains.

These, and other objects, features and advantages of this invention will become apparent from the following detailed description of the various aspects of the invention taken in conjunction with the accompanying drawings.

BRIEF DESCRIPTION OF THE DRAWINGS

FIG. 4 depicts one example of the structure of FIG. 3 after masking each raised structure intended to be a "tall" raised structure, e.g., creating a hard mask thereover, while leaving a top surface of the other raised structure(s) exposed, in accordance with one or more aspects of the present invention.

FIG. 5 depicts one example of the structure of FIG. 4 after recessing the exposed raised structures, in accordance with one or more aspects of the present invention.

FIG. 8 depicts one example of the structure of FIG. 7 after planarizing the dummy insulator layer, using the material of the previously masked raised structures as a stop, in accordance with one or more aspects of the present invention.

FIG. 9 depicts one example of the structure of FIG. 8 after recessing the isolation layer, using the PTS layer as a stop, in accordance with one or more aspects of the present invention.

DETAILED DESCRIPTION OF THE INVENTION

Figure 1:
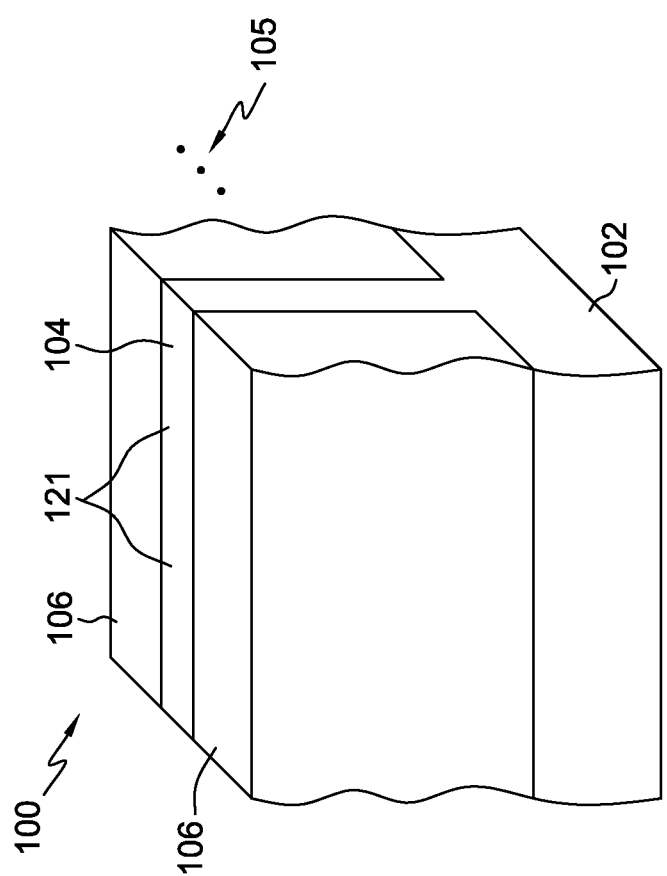
FIG. 1 is a perspective view of one example of a starting semiconductor structure, the starting structure including a substrate and multiple raised semiconductor structures (indicated by the dotted line) coupled to the substrate and surrounded on front and back sides by isolation material, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

The present invention provides a way to increase stability without a larger footprint by reducing a channel height of some co-fabricated non-planar devices. In one example, channel height reduction is done during the replacement gate process.

FIG. 1 is a perspective view of one example of a starting semiconductor structure 100, the starting structure including a substrate 102 and multiple 105 (only one shown here for simplicity) raised semiconductor structures, raised with respect to the substrate, (e.g., raised structure 104) coupled to the substrate, multiple raised structures indicated by dots 105, and surrounded on front and back sides by isolation material 106, in accordance with one or more aspects of the present invention.

In one example, the raised structures may take the form of a "fin." The raised structure(s) may be etched from a bulk substrate, and may include, for example, any of the materials listed below with respect to the substrate. Further, some or all of the raised structure(s) may include added impurities (e.g., by doping), making them n-type or p-type.

The starting structure may be conventionally fabricated, for example, using known processes and techniques. Further, unless noted otherwise, conventional processes and techniques may be used to achieve individual steps of the fabrication process of the present invention. However, although only a portion (e.g., one raised structure) is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
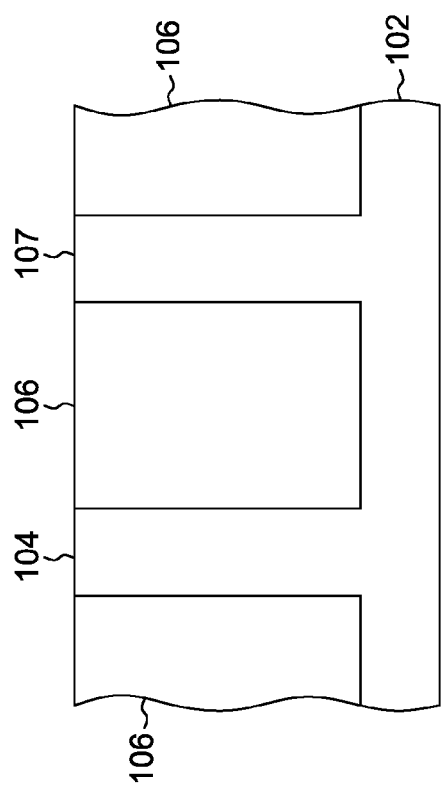
FIG. 2 is a cross-sectional view of one example of the structure of FIG. 1 showing another raised structure, in accordance with one or more aspects of the present invention.

FIG. 2 is a cross-sectional view of one example of the structure of FIG. 1 showing another raised structure 107, in accordance with one or more aspects of the present invention.

Figure 3:
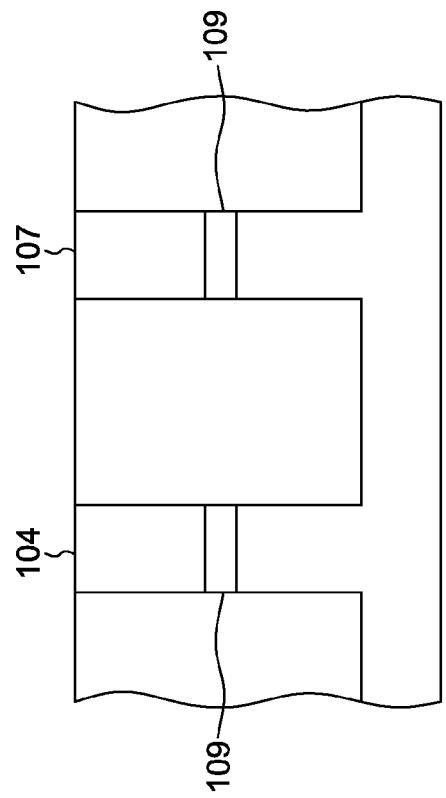
FIG. 3 depicts one example of the structure of FIG. 2 after implant of a Punch-Through Stop (PTS) in each raised structure, followed by an anneal, in accordance with one or more aspects of the present invention.

FIG. 3 depicts one example of the structure of FIG. 2 after implant of a Punch-Through Stop (PTS) 109 in each raised structure, followed by an anneal, in accordance with one or more aspects of the present invention. In one example, the PTS implant may include, for example, a n-type or p-type material countering (i.e., opposite) the type of the raised structure 107 above the PTS implant.

FIG. 4 depicts one example of the structure of FIG. 3 after masking each raised structure intended to be a "tall" raised structure, e.g., creating a hard mask 111 over raised structure 104, while leaving a top surface of raised structure 107 exposed, in accordance with one or more aspects of the present invention.

FIG. 5 depicts one example of the structure of FIG. 4 after recessing 113 the exposed raised structures (here, raised structure 107), in accordance with one or more aspects of the present invention.

Figure 6:
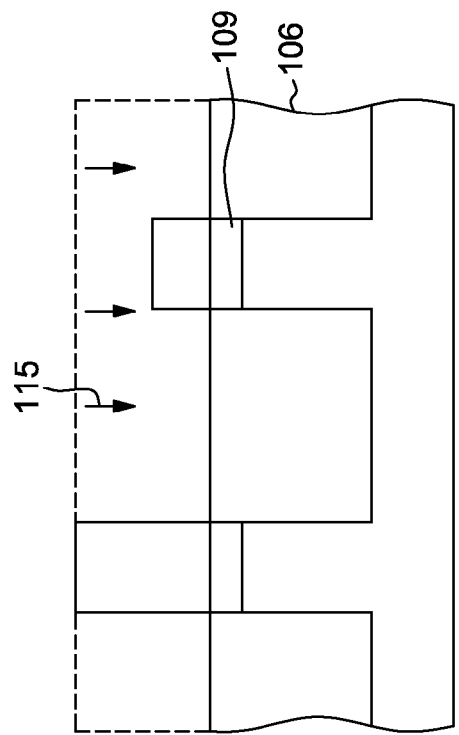
FIG. 6 depicts one example of the structure of FIG. 5 after removal of the hard masks and recessing the isolation layer, using the PTS layer as a stop, in accordance with one or more aspects of the present invention.

FIG. 6 depicts one example of the structure of FIG. 5 after removal of the hard masks (111, FIG. 5) and recessing 115 the isolation layer 106, using PTS layer 109 as a stop, in accordance with one or more aspects of the present invention. Thus, FIG. 6 depicts two different fin heights.

Note that the method described with respect to FIGS. 2-6 would be performed the same way if the substrate included silicon-on-insulator.

Figure 7:
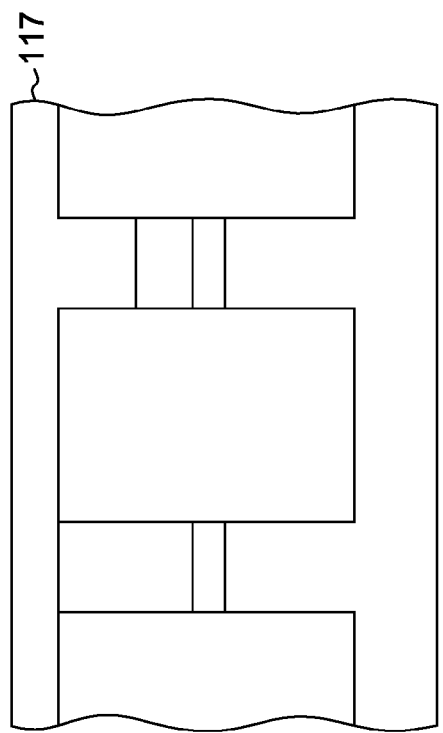
FIG. 7 depicts one example of a variation of the resulting FIG. 6 structure, after removal of the hard masks and prior to recessing the isolation material, the structure variation achieved by creating a conformal layer of a dummy insulator material (e.g., silicon nitride via atomic layer deposition), in accordance with one or more aspects of the present invention.

FIG. 7 depicts one example of a variation of the resulting FIG. 6 structure, after removal of the hard masks and prior to recessing the isolation material, the structure variation achieved by creating a conformal layer 117 of a dummy insulator material (e.g., silicon nitride via atomic layer deposition), in accordance with one or more aspects of the present invention.

FIG. 8 depicts one example of the structure of FIG. 7 after planarizing 119 the dummy insulator layer 117, using the material of the previously masked raised structures (e.g., raised structure 104) as a stop, in accordance with one or more aspects of the present invention.

FIG. 9 depicts one example of the structure of FIG. 8 after recessing 123 the isolation layer 106, using PTS layer 109 as a stop, in accordance with one or more aspects of the present invention.

Figure 10:
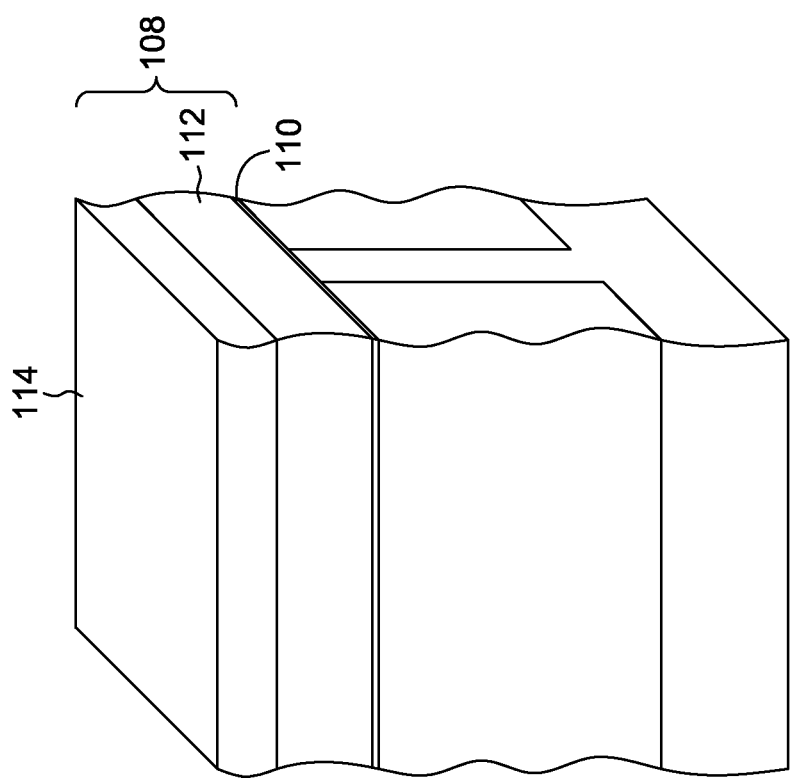
FIG. 10 depicts one example of the structure of FIG. 1 after creating a blanket dummy gate stack over the structure, without revealing the active portion of the fins, the blanket dummy gate stack including a bottom dielectric layer, a middle layer of dummy gate material and a top layer of a hard mask material (i.e., what will be the dummy gate cap), in accordance with one or more aspects of the present invention.

FIG. 10 depicts one example of the structure of FIG. 1 after creating a blanket dummy gate stack 108 over the structure, without revealing the active portion of the fins, which would be the case in a conventional FinFET process flow, the blanket dummy gate stack including a bottom dielectric layer 110, a middle layer 112 of dummy gate material and a top layer 114 of a hard mask material (i.e., the gate cap), in accordance with one or more aspects of the present invention.

Creation of the blanket layers (110, 112 and 114) for the eventual dummy gate stack may be accomplished, for example, using conventional semiconductor processes and techniques (e.g., a conventional deposition process). In one example, where the structure is silicon-based, the bottom dielectric layer may be thin relative to the other layers of the blanket stack and may include, for example, a oxide (e.g., silicon dioxide), the middle layer of dummy gate material may include, for example, amorphous silicon, and the top layer of hard mask material may include, for example, silicon nitride.

Figure 11:
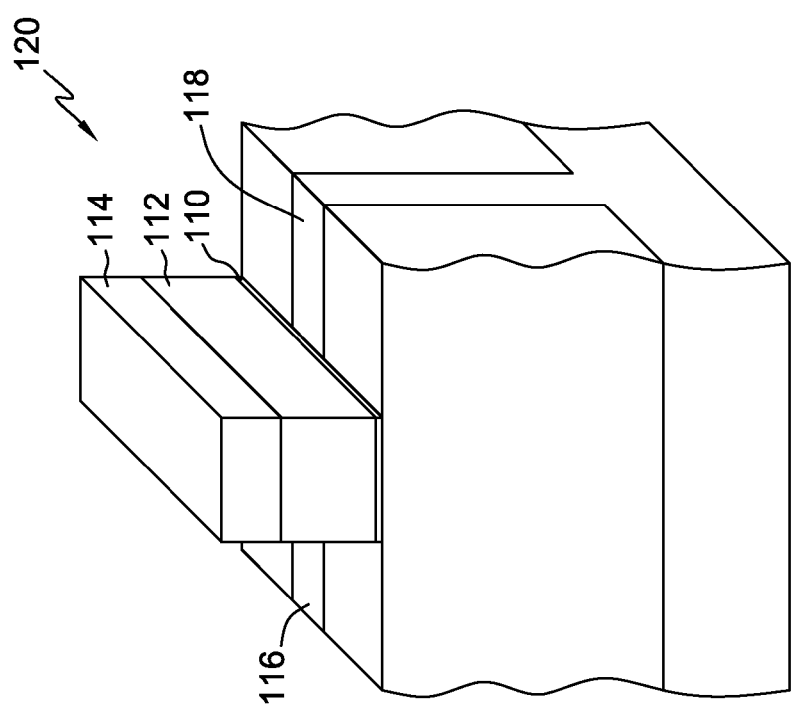
FIG. 11 depicts one example of the structure of FIG. 10 after removing portions of the blanket dummy gate stack over source and drain regions of each raised structure, leaving a dummy gate stack over a channel region of each raised structure, in accordance with one or more aspects of the present invention.

FIG. 11 depicts one example of the structure of FIG. 10 after removing portions of the blanket dummy gate stack (108, FIG. 10) over source 116 and drain 118 regions of each raised structure, leaving a dummy gate stack 120 over a channel region (121, FIG. 1) of each raised structure, in accordance with one or more aspects of the present invention.

Creation of the dummy gate stack from the blanket layers via removal of portions over source/drain regions of the raised structures may be accomplished using, for example, conventional processes and techniques (e.g., patterning and etching using Reactive Ion Etching).

Figure 12:
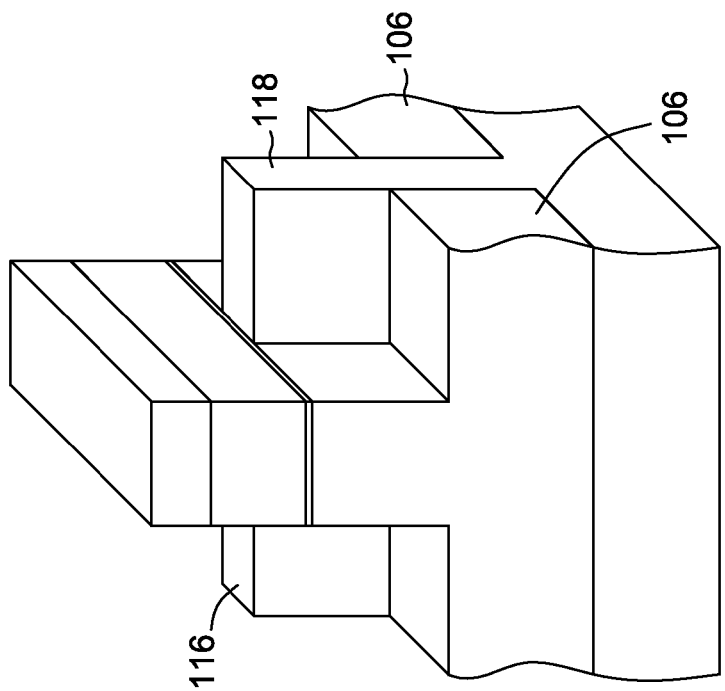
FIG. 12 depicts one example of the structure of FIG. 11 after partial removal or anisotropic recessing of isolation material to expose front and back sides of the source and drain regions, in accordance with one or more aspects of the present invention.

FIG. 12 depicts one example of the structure of FIG. 11 after partial removal or anisotropic recessing of isolation material 106 to expose front and back sides of the source and drain regions, in accordance with one or more aspects of the present invention.

Recessing of the isolation material to expose the source and drain may be accomplished by, for example, performing an anisotropic etch.

Figure 13:
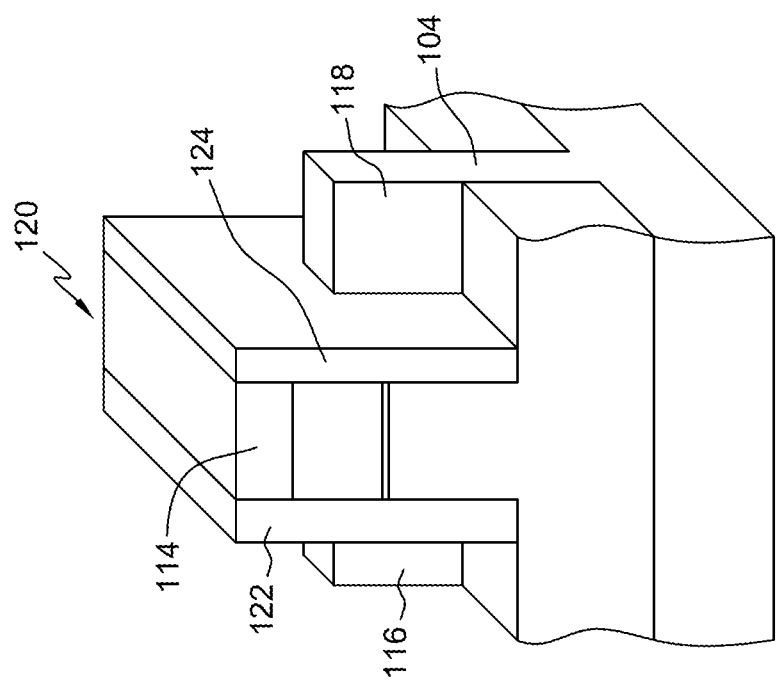
FIG. 13 depicts one example of the structure of FIG. 12 after spacers are created on opposite sides of the dummy gate stack, the spacers encompassing portions of each raised structure adjacent to the gate stack, in accordance with one or more aspects of the present invention.

FIG. 13 depicts one example of the structure of FIG. 12 after spacers 122 and 124 are created on opposite sides of the dummy gate stack 120, the spacers encompassing portions of each raised structure (e.g., raised structure 104) adjacent to the gate stack, in accordance with one or more aspects of the present invention.

The spacers may be created, for example, using conventional processes and techniques (e.g., via blanket deposition and etch), and may include, for example, silicon nitride.

Figure 14:
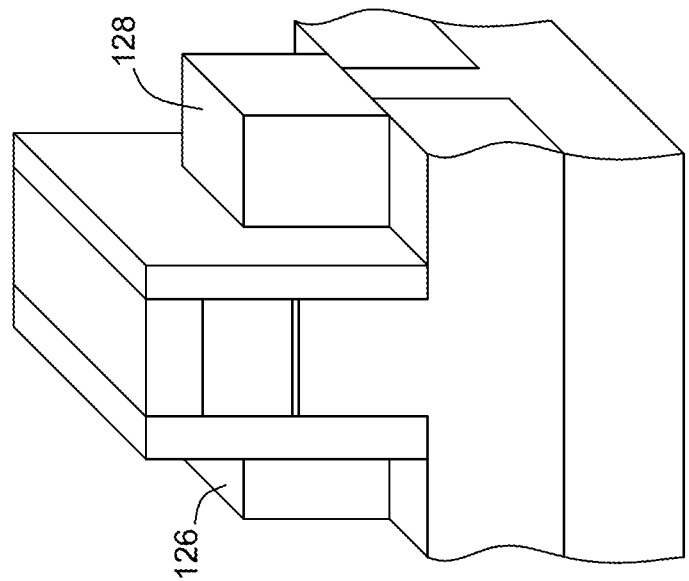
FIG. 14 depicts one example of the structure of FIG. 13 after creating epitaxial semiconductor material to encompass the exposed source and drain regions of each raised structure, in accordance with one or more aspects of the present invention.

FIG. 14 depicts one example of the structure of FIG. 13 after creating epitaxial semiconductor material 126 and 128 to encompass the exposed source (116, FIG. 13) and drain (118, FIG. 13) regions of each raised structure, in accordance with one or more aspects of the present invention.

Creation of the epitaxial semiconductor material encompassing the source and drain regions of each raised structure may be accomplished using, for example, conventional processes and techniques (e.g., by selectively growing the epitaxial material using the source and drain regions to seed the growth). Note that the epitaxial material has a uniform height across the sources and drains of all the raised structures on the substrate.

Figure 15:
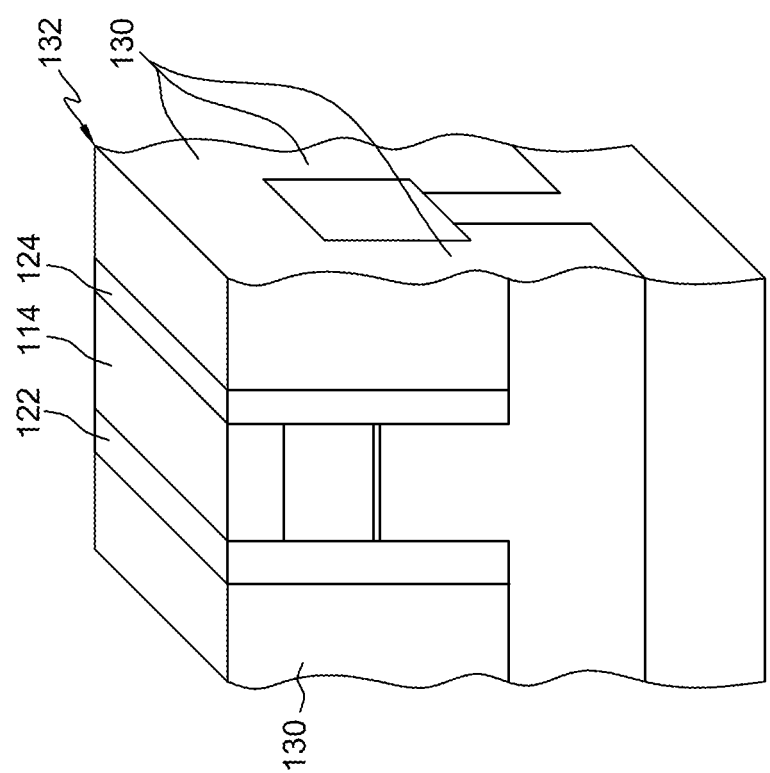
FIG. 15 depicts one example of the structure of FIG. 14 after filling in open areas around the epitaxial material of the source and drain with isolation material such that top surfaces of the gate cap, spacers and isolation material together create a planar top surface, in accordance with one or more aspects of the present invention.

FIG. 15 depicts one example of the structure of FIG. 14 after filling in open areas around the epitaxial material (126 and 128, FIG. 14) with isolation material 130 such that top surfaces of the gate cap 114, spacers (122 and 124) and isolation material create a planar top surface 132, in accordance with one or more aspects of the present invention.

In one example, filling the open areas around the source and drain epitaxy may be accomplished by a blanket deposition of dielectric material over the stricture and performing, for example, a chemical mechanical polishing (CMP) process using top surfaces of the gate cap and spacers as a stop.

Figure 16:
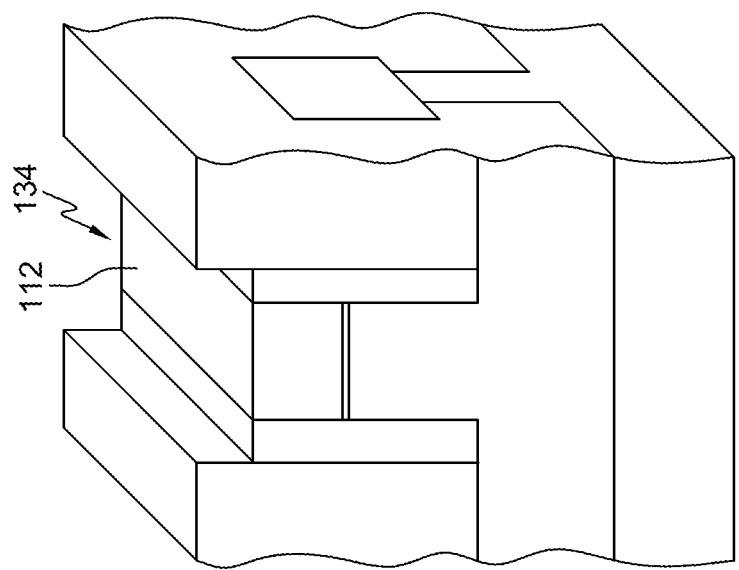
FIG. 16 depicts one example of the structure of FIG. 15 after removing the gate cap and top portions of the spacers, exposing a top surface of the dummy gate material, in accordance with one or more aspects of the present invention.

FIG. 16 depicts one example of the structure of FIG. 15 after removing the gate cap (114, FIG. 15) and top portions of the spacers (122 and 124, FIG. 15), exposing a top surface 134 of the dummy gate material 112, in accordance with one or more aspects of the present invention.

Removal of the gate cap and top portions of the spacers (e.g., portions above a top surface height of the dummy gate material) to expose the top of the dummy gate material may be accomplished using, for example, conventional Reactive Ion Etching (RIE) processes and techniques.

Figure 17:
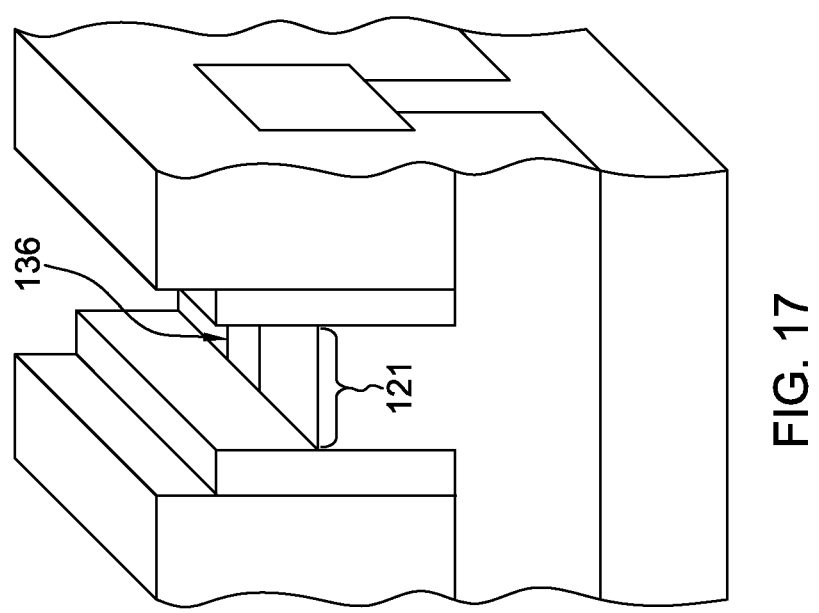
FIG. 17 depicts one example of the structure of FIG. 16 after removal of a remainder of the gate stack (i.e., the dummy gate material and the dielectric layer below), exposing a top surface of the channel region of each raised structure, in accordance with one or more aspects of the present invention.

FIG. 17 depicts one example of the structure of FIG. 16 after removal of a remainder of the dummy gate stack (120, FIG. 11) (i.e., the dummy gate material (112, FIG. 11) and the dielectric layer (110, FIG. 11) below), exposing a top surface 136 of the channel region 121 of each raised structure, in accordance with one or more aspects of the present invention.

Removal of the remainder of the dummy gate stack to expose the top surface of the channel region may be accomplished using, for example, conventional RIE and/or wet etching processes and techniques.

Figure 18:
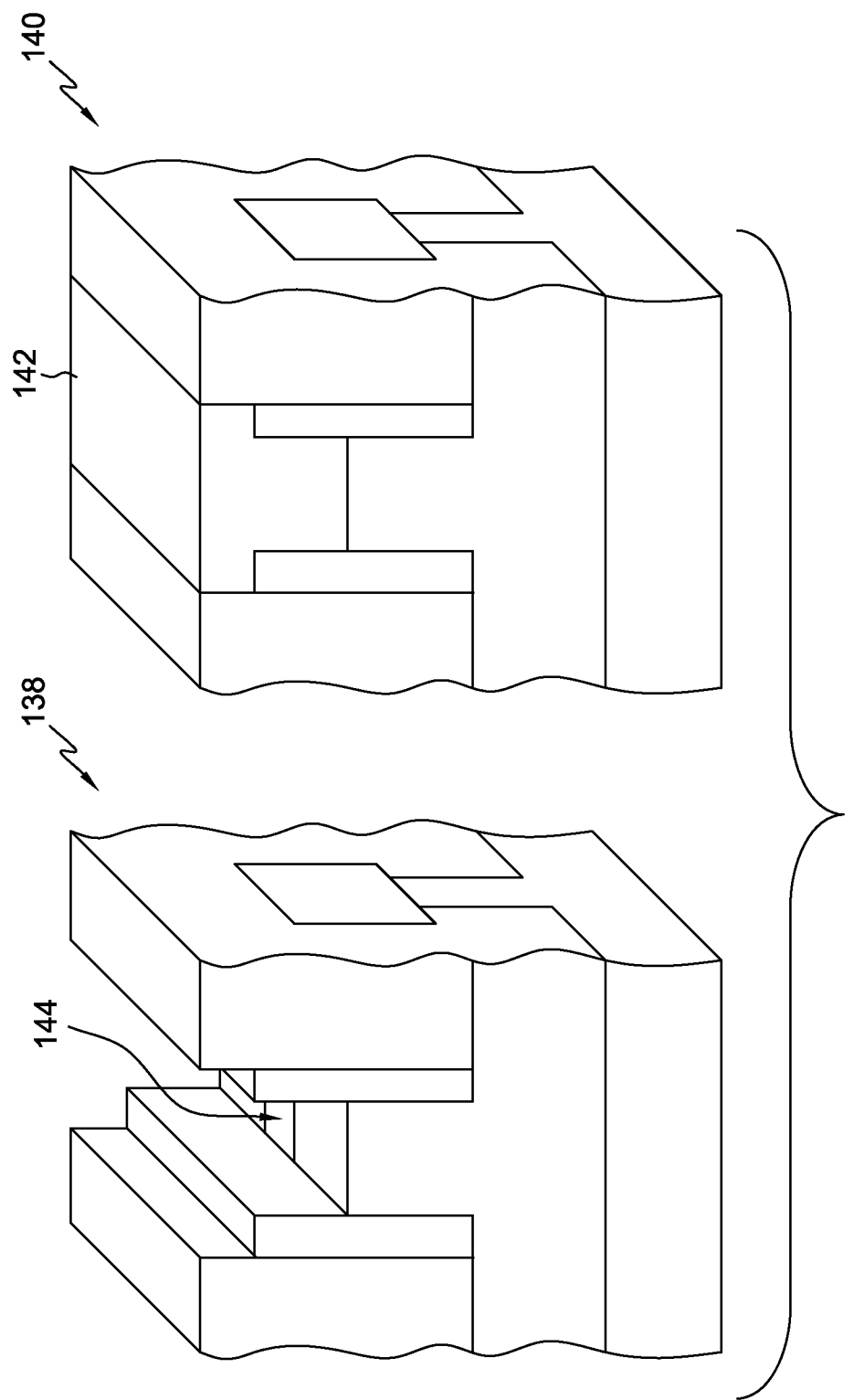
FIG. 18 depicts one example of the structure of FIG. 17 used to create two different semiconductor structures, after masking the structure on the right and partially recessing only the channel region of the structure on the left, creating a cavity and, thus, two different heights for the channel regions of the raised structures (best shown in FIG. 19), in accordance with one or more aspects of the present invention.

FIG. 18 depicts one example of the structure of FIG. 17 used to create two different semiconductor structures 138 and 140, after masking 142 the structure 140 on the right and partially recessing only the channel region (121, FIG. 17) of the structure 138 on the left, creating a cavity 144 and, thus, two different heights for the channel region of the raised structures (best shown in FIG. 19), in accordance with one or more aspects of the present invention.

In one example, the structures desired to have the higher channel height may be masked with, for example, an Optical Planarizing Layer (OPL). Partial recessing of the top-exposed channel regions may be accomplished using, for example, a selective etch based on HCl vapor, as well as other selective wet and dry etch processes. Although shown separated, it will be understood that the structures are all fabricated on a common substrate or water.

Figure 19:
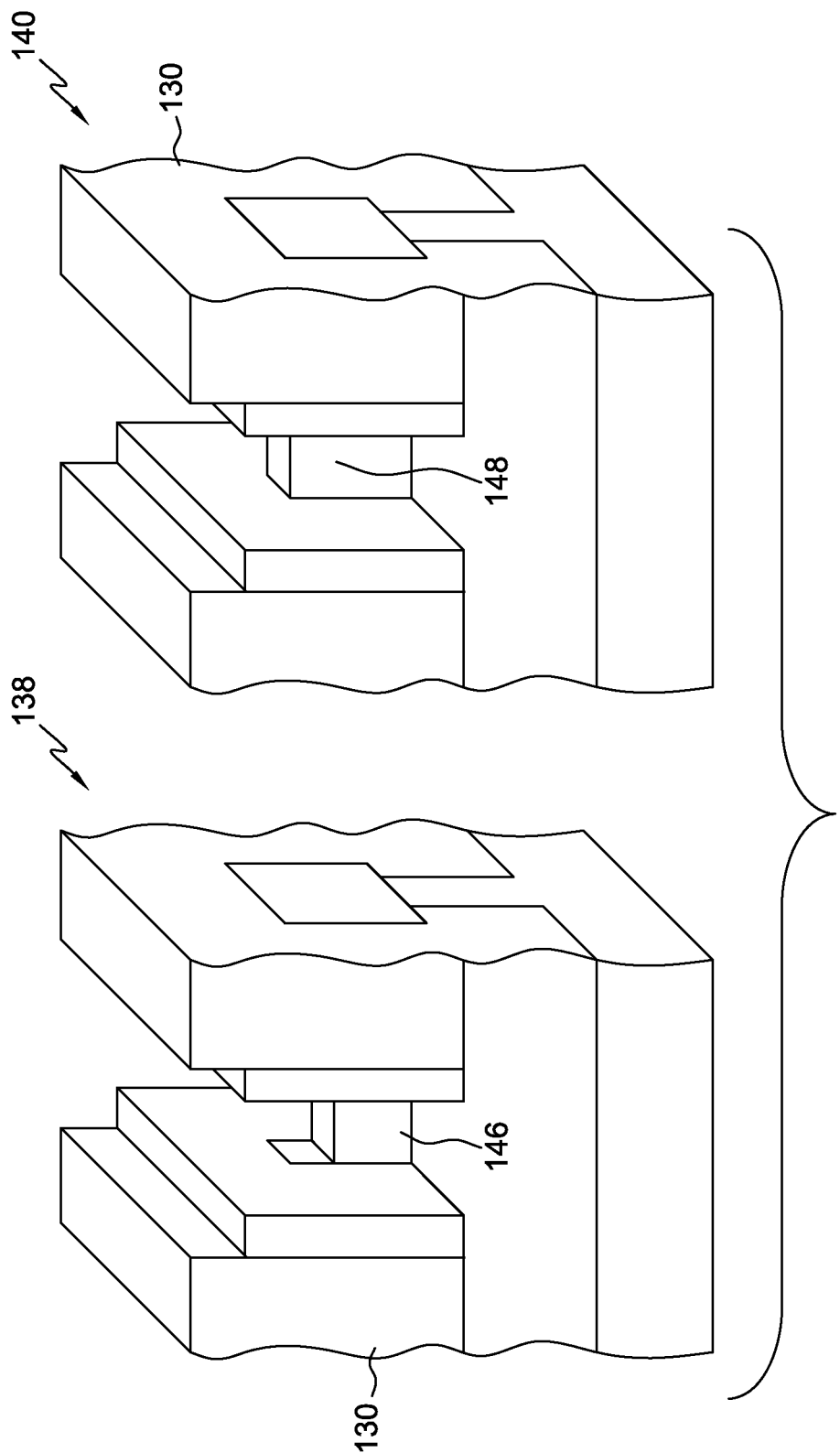
FIG. 19 depicts one example of the structure of FIG. 18 after removal of the mask from the structure on the right and recessing the dielectric for both structures between the respective pairs of spacers, exposing the front and back sides of each channel region, the channel on the left structure having a lower height than the channel on the right, in accordance with one or more aspects of the present invention.

FIG. 19 depicts one example of the structure of FIG. 18 after removal of the mask (142, FIG. 18) from structure 140 on the right and recessing the dielectric 130 for both structures between the respective pairs of spacers, exposing the front and back sides (sidewalls) of each channel region of each fin, the channel 146 of structure 138 having a lower height than the channel 148 of structure 140, in accordance with one or more aspects of the present invention.

Removal of the mask and recessing of the dielectric to expose the channel regions may be accomplished using, for example, conventional processes and techniques. Conventional FinFET processing may then proceed, including, for example, creation of a high-k insulator layer (dielectric constant above 3.9) and metal gates in the Replacement Metal Gate (RMG) module, followed by the middle and back end of the line.

In a first aspect, disclosed above is a method. The method includes providing a starting semiconductor structure, the starting structure including a substrate and multiple raised semiconductor structures coupled to the substrate and surrounded on front and back sides thereof by isolation material. The method further includes recessing at least a portion of one or more and less than all of the multiple raised structures.

In one example, the recessing may include, for example, recessing an entirety of the one or more and less than all of the multiple raised structures. In one example, recessing the entirety may include, for example, masking at least one and less than all of the multiple raised structures, and recessing one or more unmasked raised structures.

In another example, the recessing of the first aspect may include, for example, creating a dummy gate stack and spacers over a channel region of each raised structure, the dummy gate stack including a bottom dielectric layer, a middle layer of dummy gate material, and a gate cap on top, and creating a source and a drain in source and drain regions, respectively, of each raised structure. The method further includes removing each dummy gate stack and a top portion of each spacer, the removing exposing a top surface of only the channel region (i.e., not the source or drain), and partially recessing only the channel region of the one or more and less than all of the at least two raised structures.

In one example, the method may further include, for example, prior to the partially recessing, masking the channel region of any raised structures not intended to be recessed. In one example, the method may further include, after the partially recessing, removing each mask. In one example, the method may further include, after removing each mask, creating a replacement conductive gate over each channel region.

In one example, where the steps related to partially recessing are performed, creating the dummy gate stack may include, for example, blanketly creating the dummy gate stack on a top surface of the starting structure, and removing portions of the blanket dummy gate stack over the source and drain regions.

In one example, where the blanket dummy gate stack and partial removal is performed, the top surface of the starting structure may include, for example, a top surface of the multiple raised structures and a top surface of the surrounding isolation material. In addition, creating the dummy gate stack and spacers may further include recessing the isolation material surrounding the source region and the drain region to expose the source region and the drain region, and creating spacers on opposite sides the dummy gate stack. In one example, the method may further include, for example, creating a layer of isolation material adjacent each spacer and encompassing the source and the drain, top surfaces of the isolation material and the dummy gate structure and spacers creating a second planar top surface. In one example, creating the layer of isolation material adjacent each spacer may include creating a blanket layer of isolation material over the structure, and polishing a top surface of the blanket layer using the gate cap of the dummy gate stack as a stop.

In another example, where the steps related to partially recessing are performed, creating the source and the drain may include, for example, creating epitaxial semiconductor material surrounding the source region and the drain region.

In yet another example, where the steps related to partially recessing are performed, removing each dummy gate stack and top portion of the spacers may include, for example, removing the gate cap of each dummy gate structure and the top portion of the spacers, the removing exposing dummy gate material of each dummy gate stack, and removing a remainder of each dummy gate stack to expose the top surface of the channel region.

In still another example, where the steps related to partially recessing are performed, the substrate of the starting semiconductor structure may include, for example, silicon-on-insulator.

In a final example, where the steps related to partially recessing are performed, the substrate may include, for example, bulk semiconductor material.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
provigin a starting semiconductor structure, the starting semiconductor structure comprising a substrate and at least two fins on the substrate and surrounded on front and back sides thereof by a first isolation material;
recessing at least a portion of one or more and less than all of the at least two fins, resulting in at least one fin recess;
wherein the recessing comprises:
creating dummy gate stacks and spacers over channel regions of the at least two fins, each of the dummy gate stacks comprising a bottom dielectric layer, a middle layer of dummy gate material, and a top gate cap;
creating sources and drains in source and drain regions, respectively, of the at least two fins;
removing the dummy gate stacks and top portions of the spacers, the removing exposing a top planar surface of each of the channel regions while avoiding exposing surfaces of the channel regions other than the top planar surface of each of the channel regions; and
recessing the top planar surface of each of the channel regions of the one or more and less than all of the at least two fins while avoiding recessing the sources and drains.

2. The method of claim 1, further comprising, prior to the recessing, forming a mask over the channel regions of the other of the at least one and less than all of the at least two fins.

3. The method of claim 2, further comprising, after the recessing, removing the mask.

4. The method of claim 3, further comprising, after removing the mask, creating replacement conductive gates over the channel regions.

5. The method of claim 4, wherein creating the dummy gate stacks comprises:
creating a blanket dummy gate stack on a top surface of the starting semiconductor structure; and
removing portions of the blanket dummy gate stack over the source and drain regions.

6. The method of claim 5, wherein the top surface of the starting semiconductor structure comprises a top surface of the at least two fins and a top surface of the first isolation material, and wherein creating the dummy gate stacks and the spacers further comprises:
recessing the first isolation material surrounding the source regions and the drain regions to expose the source regions and the drain regions; and
creating the spacers on opposite sides the dummy gate stacks.

7. The method of claim 6, further comprising creating a layer of a second isolation material adjacent each of the spacers and encompassing the source and the drain, top surfaces of the second isolation material and the dummy gate stacks and the spacers, creating a second planar top surface.

8. The method of claim 7, wherein creating the layer of the second isolation material adjacent each of the spacers comprises:
creating a blanket layer of the second isolation material over each of the spacers and the top gate cap; and
polishing a top surface of the blanket layer using the top gate cap of the dummy gate stack as a stop.

9. The method of claim 1, wherein creating the sources and the drains comprises creating epitaxial semiconductor material surrounding the source regions and the drain regions.

10. The method of claim 1, wherein removing the dummy gate stacks and top portions of the spacers comprises:
removing the top gate caps of the dummy gate stacks and the top portions of the spacers, the removing exposing the middle layer of dummy gate material of the dummy gate stacks; and
removing a remainder of the dummy gate stacks to expose the top planar surface of each of the channel regions.

11. The method of claim 1, wherein the substrate comprises silicon-on-insulator.

12. The method of claim 1, wherein the substrate comprises bulk semiconductor material.

* * * * *